(12) United States Patent
Ranganathan et al.

(10) Patent No.: US 12,345,756 B2
(45) Date of Patent: *Jul. 1, 2025

(54) INTEGRATED TEST CELL USING ACTIVE THERMAL INTERPOSER (ATI) WITH PARALLEL SOCKET ACTUATION

(71) Applicant: ADVANTEST TEST SOLUTIONS, INC., San Jose, CA (US)

(72) Inventors: Karthik Ranganathan, San Jose, CA (US); Gregory Cruzan, San Jose, CA (US); Samer Kabbani, San Jose, CA (US); Gilberto Oseguera, San Jose, CA (US); Rohan Gupte, San Jose, CA (US); Homayoun Rezai, San Jose, CA (US); Kenneth Santiago, San Jose, CA (US); Marc Ghazvini, San Jose, CA (US)

(73) Assignee: Advantest Test Solutions, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/536,029

(22) Filed: Dec. 11, 2023

(65) Prior Publication Data

US 2024/0133943 A1    Apr. 25, 2024

Related U.S. Application Data

(63) Continuation of application No. 17/832,348, filed on Jun. 3, 2022, now Pat. No. 11,841,392, which is a
(Continued)

(51) Int. Cl.
*G01R 31/28* (2006.01)
*G01R 31/317* (2006.01)
*G01R 31/319* (2006.01)

(52) U.S. Cl.
CPC ..... *G01R 31/2844* (2013.01); *G01R 31/2863* (2013.01); *G01R 31/2875* (2013.01);
(Continued)

(58) Field of Classification Search
CPC .............. G01R 1/0458; G01R 1/07378; G01R 31/2844; G01R 31/2863; G01R 31/2867;
(Continued)

(56) References Cited

U.S. PATENT DOCUMENTS 5,126,656 A    6/1992   Jones
5,164,661 A    11/1992  Jones
(Continued)

FOREIGN PATENT DOCUMENTS

CN    101073016 A    11/2007
CN    103038751 A    4/2013
(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Vinh P Nguyen

(57) ABSTRACT

A testing apparatus comprises a test interface board comprising a plurality of socket interface boards, wherein each socket interface board comprises: a) an open socket to hold a DUT; b) a discrete active thermal interposer comprising thermal properties and operable to make thermal contact with the DUT; c) a superstructure operable to contain the discrete active thermal interposer; and d) an actuation mechanism operable to provide a contact force to bring the discrete active thermal interposer in contact with the DUT.

18 Claims, 9 Drawing Sheets

Related U.S. Application Data continuation of application No. 16/986,037, filed on Aug. 5, 2020, now Pat. No. 11,493,551.

(60) Provisional application No. 63/042,359, filed on Jun. 22, 2020.

(52) U.S. Cl.
CPC ... G01R 31/2877 (2013.01); G01R 31/31713 (2013.01); G01R 31/31905 (2013.01)

(58) Field of Classification Search
CPC ............ G01R 31/2874; G01R 31/2875; G01R 31/2877; G01R 31/31713; G01R 31/31905
See application file for complete search history.

(56) References Cited

U.S. PATENT DOCUMENTS

| | | | |
|---|---|---|---|
| 5,239,093 A | 8/1993 | Cheng | |
| 5,315,240 A | 5/1994 | Jones | |
| 5,329,093 A | 7/1994 | Okano | |
| 5,420,521 A | 5/1995 | Jones | |
| 5,738,531 A | 4/1998 | Beaman et al. | |
| 5,772,451 A * | 6/1998 | Dozier, II | H05K 3/308 257/E21.507 |
| 5,821,505 A | 10/1998 | Tustaniwskyj et al. | |
| 6,184,504 B1 | 2/2001 | Cardella | |
| 6,359,264 B1 | 3/2002 | Schaper et al. | |
| 6,389,225 B1 | 5/2002 | Malinoski et al. | |
| 6,452,113 B2 | 9/2002 | Dibene, II et al. | |
| 6,498,899 B2 | 12/2002 | Malinoski et al. | |
| 6,515,470 B2 | 2/2003 | Suzuki et al. | |
| 6,668,570 B2 | 12/2003 | Wall et al. | |
| 6,711,904 B1 | 3/2004 | Law et al. | |
| 6,825,681 B2 | 11/2004 | Feder et al. | |
| 6,862,405 B2 | 3/2005 | Malinoski et al. | |
| 6,985,000 B2 | 1/2006 | Feder et al. | |
| 7,042,240 B2 | 5/2006 | Lopez et al. | |
| 7,126,217 B2 | 10/2006 | Chiu et al. | |
| 7,138,811 B1 | 11/2006 | Mahoney et al. | |
| 7,151,388 B2 | 12/2006 | Gopal et al. | |
| 7,311,782 B2 | 12/2007 | Strang et al. | |
| 7,355,428 B2 | 4/2008 | Kabbani et al. | |
| 7,411,792 B2 | 8/2008 | Richards et al. | |
| 7,436,059 B1 | 10/2008 | Ouyang | |
| 7,489,156 B2 * | 2/2009 | Hopkins | G11C 29/56 324/762.02 |
| 7,519,880 B1 | 4/2009 | Johnson et al. | |
| 7,626,407 B2 | 12/2009 | Kabbani | |
| 7,659,738 B2 | 2/2010 | Hong | |
| 7,726,145 B2 | 6/2010 | Nakamura | |
| 7,755,899 B2 | 7/2010 | Stenmark | |
| 7,781,883 B2 | 8/2010 | Sri-Jayantha et al. | |
| 7,830,164 B2 | 11/2010 | Earle et al. | |
| 7,848,106 B2 | 12/2010 | Merrow | |
| 8,343,280 B2 | 1/2013 | Iimuro | |
| 8,466,705 B1 * | 6/2013 | Howell | G01R 1/0458 324/757.01 |
| 8,508,245 B1 * | 8/2013 | Barabi | G01R 1/0458 324/750.04 |
| 8,558,540 B2 | 10/2013 | Wu et al. | |
| 8,772,682 B2 | 7/2014 | Ambal et al. | |
| 8,927,907 B2 | 1/2015 | Fink et al. | |
| 8,970,244 B2 | 3/2015 | Di Stefano et al. | |
| 9,080,820 B2 | 7/2015 | Bolton | |
| 9,291,667 B2 | 3/2016 | Armstrong et al. | |
| 9,307,578 B2 | 4/2016 | Pease | |
| 9,310,145 B2 | 4/2016 | Colongo et al. | |
| 9,414,526 B2 | 8/2016 | Mann et al. | |
| 9,494,353 B2 | 11/2016 | Yu et al. | |
| 9,594,113 B2 | 3/2017 | Davis et al. | |
| 9,766,287 B2 | 9/2017 | Naraski et al. | |
| 9,841,772 B2 | 12/2017 | Bucher | |
| 10,056,225 B2 | 8/2018 | Gaff et al. | |
| 10,126,356 B2 | 11/2018 | Barabi et al. | |
| 10,163,668 B2 | 12/2018 | Steinhauser | |
| 10,354,785 B2 | 7/2019 | Yamaguchi et al. | |
| 10,656,200 B2 | 5/2020 | Cruzan et al. | |
| 10,775,408 B2 | 9/2020 | Carvalho et al. | |
| 10,908,207 B2 | 2/2021 | Barabi et al. | |
| 10,948,534 B2 * | 3/2021 | Bowyer | G01R 31/2808 |
| 10,955,466 B2 | 3/2021 | Tsai et al. | |
| 10,983,145 B2 * | 4/2021 | Akers | G01R 31/2893 |
| 11,143,697 B2 | 10/2021 | Wolff | |
| 11,493,551 B2 | 11/2022 | Ranganathan et al. | |
| 2002/0026258 A1 | 2/2002 | Suzuki et al. | |
| 2002/0118032 A1 | 8/2002 | Norris et al. | |
| 2003/0155939 A1 | 8/2003 | Lutz et al. | |
| 2004/0017185 A1 | 1/2004 | Song et al. | |
| 2005/0026476 A1 | 2/2005 | Mok et al. | |
| 2005/0086948 A1 | 4/2005 | Milke-Rojo et al. | |
| 2005/0103034 A1 | 5/2005 | Hamilton et al. | |
| 2005/0151553 A1 | 7/2005 | Kabbani et al. | |
| 2006/0158207 A1 | 7/2006 | Reitinger | |
| 2006/0290370 A1 | 12/2006 | Lopez | |
| 2009/0160472 A1 | 6/2009 | Segawa et al. | |
| 2009/0218087 A1 | 9/2009 | Oshima | |
| 2010/0042355 A1 | 2/2010 | Aube et al. | |
| 2011/0050268 A1 | 3/2011 | Co et al. | |
| 2011/0074080 A1 | 3/2011 | Di Stefano et al. | |
| 2013/0181576 A1 | 7/2013 | Shiozawa et al. | |
| 2013/0285686 A1 | 10/2013 | Malik et al. | |
| 2014/0035715 A1 | 2/2014 | Takashashi et al. | |
| 2014/0251214 A1 | 9/2014 | Cuvalci et al. | |
| 2015/0028908 A1 | 1/2015 | Kushnick et al. | |
| 2015/0028912 A1 | 1/2015 | Cho et al. | |
| 2015/0137842 A1 | 5/2015 | Murakami et al. | |
| 2015/0168450 A1 | 6/2015 | Wooden et al. | |
| 2015/0226794 A1 | 8/2015 | Chen | |
| 2016/0084880 A1 | 3/2016 | LoCicero et al. | |
| 2016/0247552 A1 | 8/2016 | Kim et al. | |
| 2016/0351526 A1 | 12/2016 | Boyd et al. | |
| 2017/0102409 A1 | 4/2017 | Sarhad et al. | |
| 2018/0024188 A1 | 1/2018 | Cruzan et al. | |
| 2018/0189159 A1 | 7/2018 | Carmichael et al. | |
| 2018/0218926 A1 | 8/2018 | Stuckey et al. | |
| 2019/0064254 A1 | 2/2019 | Bowyer et al. | |
| 2019/0162777 A1 | 5/2019 | Chiang et al. | |
| 2019/0271719 A1 | 9/2019 | Sterzbach | |
| 2019/0310314 A1 | 10/2019 | Liu et al. | |
| 2019/0346482 A1 | 11/2019 | Kiyokawa et al. | |
| 2020/0041564 A1 | 2/2020 | Cojocneanu et al. | |
| 2020/0060019 A1 | 2/2020 | Tustaniwskyj et al. | |
| 2020/0363104 A1 | 11/2020 | MacDonald et al. | |
| 2020/0371155 A1 | 11/2020 | Walczyk et al. | |
| 2021/0071917 A1 | 3/2021 | Pei et al. | |
| 2021/0183668 A1 | 6/2021 | Cagle et al. | |
| 2021/0293495 A1 | 9/2021 | Barako et al. | |
| 2021/0396801 A1 | 12/2021 | Ranganathan et al. | |
| 2022/0044084 A1 | 2/2022 | Cardy | |
| 2022/0082587 A1 | 3/2022 | Gopal et al. | |
| 2022/0137092 A1 | 5/2022 | Ranganathan et al. | |
| 2022/0137129 A1 | 5/2022 | Ranganathan et al. | |
| 2022/0206061 A1 | 6/2022 | Ranganathan et al. | |

FOREIGN PATENT DOCUMENTS

| | | |
|---|---|---|
| CN | 105144114 A | 12/2015 |
| CN | 109716513 | 5/2019 |
| CN | 110214270 | 9/2019 |
| CN | 110618903 A | 12/2019 |
| EP | 3270261 A1 | 1/2018 |
| JP | 2005156172 A | 6/2005 |
| JP | 2008275512 A | 11/2008 |
| KR | 20070027524 A | 3/2007 |
| KR | 2017-0056187 | 5/2017 |
| TW | 446682 | 7/2001 |
| TW | 200535440 A | 11/2005 |
| TW | 200620596 | 6/2006 |
| TW | 200628818 | 8/2006 |
| TW | 201226579 | 7/2012 |
| TW | 201229535 | 7/2012 |

(56) References Cited

FOREIGN PATENT DOCUMENTS

| | | |
|---|---|---|
| TW | 201323883 A | 6/2013 |
| TW | 201333497 A | 8/2013 |
| TW | 201504647 A | 2/2015 |
| TW | 201608254 A | 3/2016 |
| TW | 201636618 A | 10/2016 |
| TW | 201712459 | 4/2017 |
| TW | 201840996 A | 11/2018 |
| TW | 651540 B | 2/2019 |
| TW | 201834134 | 1/2020 |
| TW | 202004980 | 1/2020 |
| TW | 202043787 A | 12/2020 |
| WO | 2016122039 A1 | 8/2016 |
| WO | 2017015052 A1 | 1/2017 |
| WO | 2017039936 A1 | 3/2017 |
| WO | 2017112076 A1 | 6/2017 |
| WO | 2020159954 A1 | 8/2020 |

\* cited by examiner

INTEGRATED TEST CELL USING ACTIVE THERMAL INTERPOSER (ATI) WITH PARALLEL SOCKET ACTUATION

CROSS-REFERENCE TO RELATED APPLICATION

This application is a Continuation of and claims priority to U.S. patent application Ser. No. 17/832,348, titled "Integrated Test Cell Using Active Thermal Interposer (ATI) With Parallel Socket Actuation," filed on Jun. 3, 2022, which is a Continuation and claims priority to U.S. patent application Ser. No. 16/986,037, titled "Integrated Test Cell Using Active Thermal Interposer (ATI) With Parallel Socket Actuation," filed Aug. 5, 2020, now issued as U.S. Pat. No. 11,493,551, which claims priority to U.S. Provisional Application 63/042,359, titled "Integrated Test Cell Using Active Thermal Interposer (ATI) With Parallel Socket Actuation," filed on Jun. 22, 2020. The entire contents of each of the above-listed applications is hereby incorporated by reference for all purposes as if fully set forth herein.

FIELD OF THE INVENTION

The present disclosure relates generally to the field of automated test equipment and more specifically to techniques of controlling such equipment.

BACKGROUND OF THE INVENTION

Automated test equipment (ATE) includes any testing assembly that performs a test on a semiconductor wafer or die, an integrated circuit (IC), a circuit board, or a packaged device such as a solid-state drive. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer. Ate systems can also be used to test and record device performance for pass/fail and for device binning determinations.

When a typical ATE system tests a device (commonly referred to as a device under test or DUT), the ATE system applies stimuli (e.g. electrical signals) to the device and checks responses (e.g., currents and voltages) of the device. Typically, the end result of a test is either "pass" if the device successfully provides certain expected responses within pre-established tolerances, or "fail" if the device does not provide the expected responses within the pre-established tolerances. More sophisticated ATE systems are capable of evaluating a failed device to potentially determine one or more causes of the failure. Other ATE systems can categorize a performance of a device for binning purposes.

FIG. 1 illustrates a conventional cycle for testing DUTs. At step 1, a single site Socket Interface Board (SIB) (or customer application board) 150 is designed. Each SIB 150 typically comprises a socket that can hold a single DUT. At step 2, the SIBs can be scaled to multiple sites. So, for example, several SIBs (e.g., 24 SIBs) can be implemented on one Test Interface Board (TIB) 185 (also called a Burn-in-Board or BIB). At step 3, the TIB 120 is connected with a power distribution board 165. The power distribution board 165 comprises the power backplane with which the TIB 120 connects. The TIB 120 and power distribution board 165 are communicatively coupled together and can, in one instance, occupy a single slot in a tester. For example, the TIB 120 and power distribution board 165 may be loaded into a single slot tester 110. Alternatively, at step 4, the TIB 120 may be loaded by a handler 195 into a multi-slot tester 196. Similarly, the handler 195 is able to load multiple other TIBs in respective slots within the tester 196. Furthermore, once testing is completed, the handler 195 is able to swap out the TIBs as well.

A first type of conventional tester system comprises: a) a tester (including a power delivery board and controls); b) a tester board such as an ATE load board or TIB with an SIB such as the one discussed in connection with FIG. 1; c) an open socket to hold a DUT; d) a thermal system that heats or cools the device including a thermal control system and a thermal array that includes a thermal interposer (or passive interposer or memory nest); and e) a handler that places DUTs into the socket. In this type of tester system, the socket is open and, therefore, the contact force to hold the DUT in the socket originates from the thermal array or force array. As noted above, the thermal system includes a custom or device-specific interposer that connects with the DUT. Intimate thermal contact is needed between the interposer and the DUT and, therefore, the interposer needs to be molded or shaped precisely like the top side of the DUT. Further, it should be noted that the thermal control system for the first type of conventional tester system comprises a single component with all the electrical, mechanical and thermal features to control all the DUTs on the TIB at the same time, e.g., all 24 DUTs on the TIB. In other words, the thermal control system is typically a single piece of equipment.

One example of this type of conventional tester system with a passive interposer and non-thermal Package on Package (POP) memory nest is described in U.S. Pat. No. 10,656,200, titled "High Volume System Level Testing of Devices with POP Structures," which is incorporated herein by reference as background material.

This type of conventional tester system has some drawbacks, however. All the specifications need to be set and rendered permanent ahead of time, e.g., maximum heating and maximum cooling specifications need to be "frozen." The thermal system specifications cannot be changed to accommodate downstream devices. The thermal system is a generic thermal system to which the interposer is attached. The interposer is not a separate piece by itself. Accordingly, this type of conventional tester can only be used with a single temperate zone per device, e.g., the entire device is heated or cooled to a single temperature within the zone. For example, if the thermal system was designed to operate between 0 C and 70 C, it could not accommodate a new DUT that needed to be tested at 80 C.

Another drawback of this type of tester system is that an extra interface is needed between the thermal system and the DUT. Additional thermal interface layers are present between the cooling/heating element of the thermal system and the DUT, thereby, degrading thermal performance. Finally, one of the drawbacks of this type of tester system is that the contact force specifications cannot be customized downstream. The thermal system provides contact force for the DUT. This force cannot be altered downstream across products. For example, if the thermal system provides 100 kg of force, it cannot be changed for other DUTs with different sensitivities.

A second type of conventional tester system is a traditional slot-based burn in system and comprises: a) a tester (including a power delivery board and controls); b) a tester board such as an ATE load board or TIB with a SIB; c) a closed socket to hold the DUT; d) thermal system that heats or cools the DUT including a thermal control system and a thermal array that has a universal interface across products; and a e) a handler that opens the socket and places the DUT into the socket. In the system, after the handler places the DUT into the socket, the socket automatically closes. Note, that the closed socket in this type of tester system is self-actuating and may include a device specific interposer and a flat contact surface. Part of the socket force in this system originates from the self-actuating socket. The other part of the contact force comes from the thermal array or force array.

The thermal system associated with the second type of conventional tester system does not have a device specific interface. Instead, it has a universal interface that interfaces with the lid of the socket. The thermal system interface can be generic because it does not come into contact with a specialized DUT interface. The socket, however, comprises the customization needed to interface with a respective DUT.

This type of conventional tester system also has similar drawbacks to the first type of conventional tester system. All the specifications need to be frozen ahead of time, e.g., maximum heating and maximum cooling specifications need to be frozen. The thermal system specifications cannot be changed to accommodate downstream devices. Another drawback of this type of tester system is that an extra interface (e.g., the socket lid) is needed between the thermal system and the DUT. This extra required interface degrades thermal performance. Finally, one of the drawbacks of this type of tester system is that the contact force specifications (e.g. pressure applied by the socket lid) cannot be customized downstream. This force applied by the socket lid cannot be altered downstream across products.

The actuation systems used with conventional testers also have certain drawbacks associated with them. For example, a traditional actuation system on a classic handler aligns individually via individual thermal interposer heads (or passive heads) and then actuates individually. Traditional actuation systems typically cannot actuate in parallel thereby resulting in extra hardware (e.g., a tester system may need as many actuation heads as devices).

BRIEF SUMMARY OF THE INVENTION

Accordingly, a need exists for a tester system that uses discrete thermal interposers for each DUT so that the cooling specifications do not need to be frozen ahead of time. Further, a need exists for a thermal system where the heating and cooling abilities are incorporated into the thermal interposer itself. Combining the thermal characteristics into the interposer advantageously precludes extra interfaces between the DUT and the thermal system. Finally, a need exists for an actuation system that allows the contact force that is applied to DUTs on a TIB to be customized and applied in parallel for the various DUTs on a TIB.

More specifically, embodiments of the present invention comprise an integrated test cell comprising: a) a tester (including a power delivery board and controls); b) a tester board such as an ATE load board or Test Interface Board (TIB) with a Socket Interface Board (SIB); c) an open socket to hold a DUT; d) an active thermal interposer where the interposer is a distinct piece by itself (unlike conventional test systems, the interposer is not part of the socket or the thermal system); e) a superstructure/lid that contains the active thermal interposer (ATI) or passive interposer and is actuated by a parallel socket actuation (PSA) system; f) a thermal system that heats or cools the device including a thermal control system (for convection or conducted cooling and heating) that has a universal interface across products; and g) a handler that places DUTs into the socket. In an embodiment, the active thermal interposer has the core functionality of a temperature control system put into a separate piece. For example, the active thermal interposer has thermal capabilities and may be able to heat or cool devices.

In one embodiment, a testing apparatus is disclosed. The testing apparatus comprises a test interface board comprising a plurality of socket interface boards, wherein each socket interface board comprises: a) a socket to hold a DUT; b) a discrete active thermal interposer comprising thermal properties and operable to make thermal contact with the DUT; c) a superstructure operable to contain the discrete active thermal interposer; and d) an actuation mechanism operable to provide a contact force to bring the discrete active thermal interposer in contact with the DUT.

In another embodiment, a testing apparatus is disclosed. The testing apparatus comprises a test interface board comprising a plurality of socket interface boards, wherein each socket interface board comprises: a) a open socket to hold a DUT; b) a passive interposer operable to make contact with the DUT; c) a superstructure operable to contain the passive interposer; and d) an actuation mechanism operable to provide a contact force to bring the passive interposer in contact with the DUT; and e) a thermal system operable to heat or cool a device under test (DUT) comprising a universal interface, wherein the thermal system is operable to make contact with the passive interposer.

In a different embodiment, a method of configuring an integrated test cell is disclosed. The method comprises disposing a discrete active thermal interposer comprising thermal properties and operable to make thermal contact with a DUT within a superstructure. Further, the method comprises aligning the discrete active thermal interposer with the DUT by aligning pins on the superstructure within a socket in which the DUT is disposed using a parallel actuation system. Finally, the method comprises actuating the socket in parallel with other sockets disposed on a same test board as the superstructure, wherein the actuating comprises actuating one or more cam latches on the superstructure to provide a contact force to bring the discrete active thermal interposer in contact with the DUT.

Using the beneficial aspects of the systems described, without their respective limitations, embodiments of the present invention provide a novel solution to address these problems.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
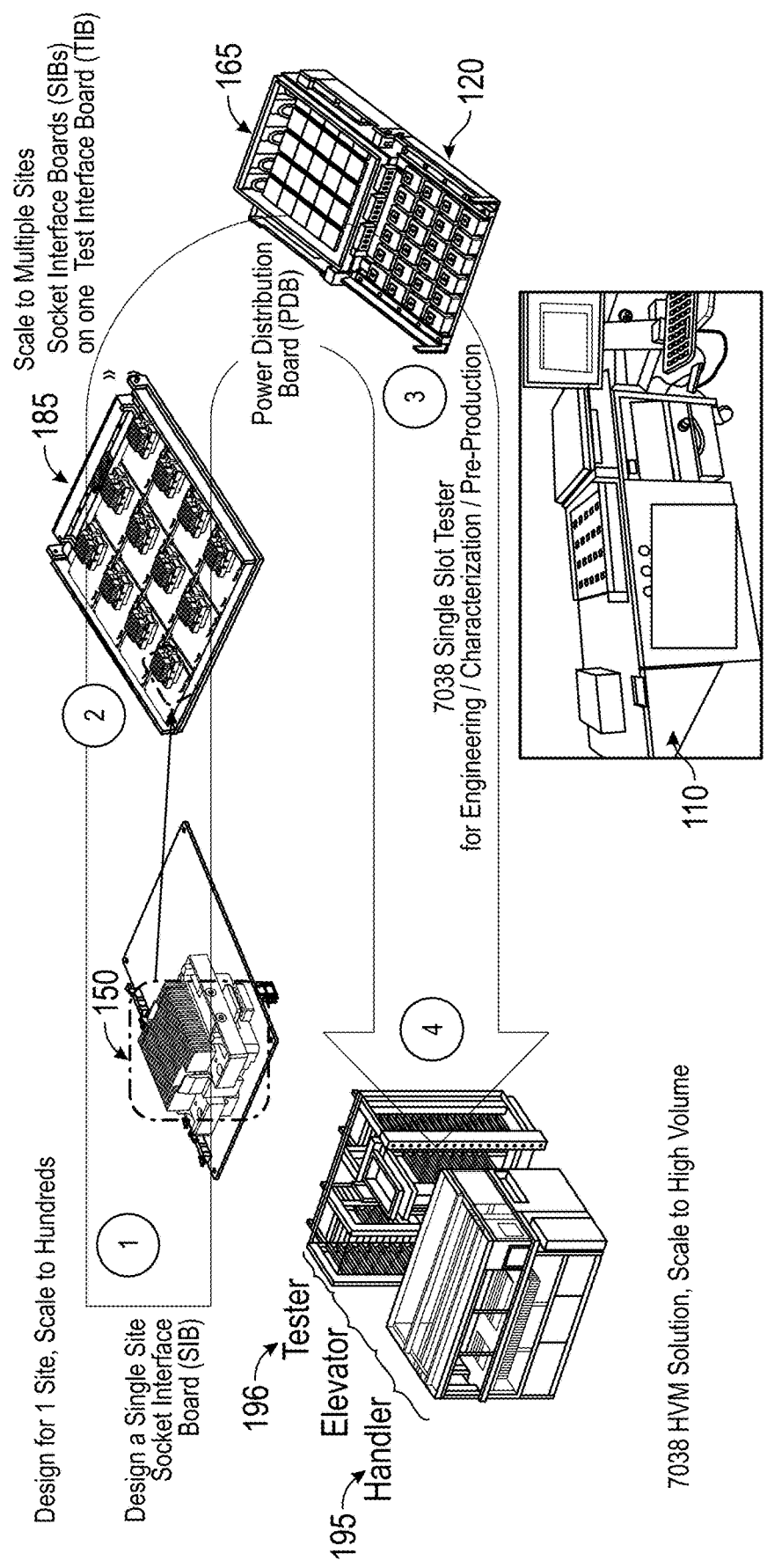
FIG. 1 illustrates a conventional cycle using an ATE system for testing DUTs.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "integrating," "actuating," "latching," or the like, refer to actions and processes of a computer system or similar electronic computing device or processor. The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Integrated Test Cell Using Active Thermal Interposer (ATI) with Parallel Socket Actuation Embodiments of the present invention comprise an integrated test cell comprising: a) a tester (including a power delivery board and controls); b) a tester board such as an ATE load board or Test Interface Board (TIB) with a Socket Interface Board (SIB); c) an open socket to hold a DUT; d) an active thermal interposer where the interposer is a distinct piece by itself (unlike conventional test systems, the interposer is not part of the socket or the thermal system); e) a superstructure/lid that contains the active thermal interposer (ATI) or passive interposer and is actuated by a parallel socket actuation (PSA) system; f) a thermal system that heats or cools the device including a thermal control system (for convection or conducted cooling and heating) that has a universal interface across products; and g) a handler that places DUTs into the socket. In an embodiment, the active thermal interposer has the core functionality of a temperature control system configured into a discrete piece. For example, the active thermal interposer has thermal capabilities and may be able to heat or cool devices.

In an embodiment, each DUT on the TIB advantageously interfaces with a discrete thermal interposer where each thermal interposer is specific to a respective DUT and makes intimate thermal contact with the respective DUT.

Figure 2:
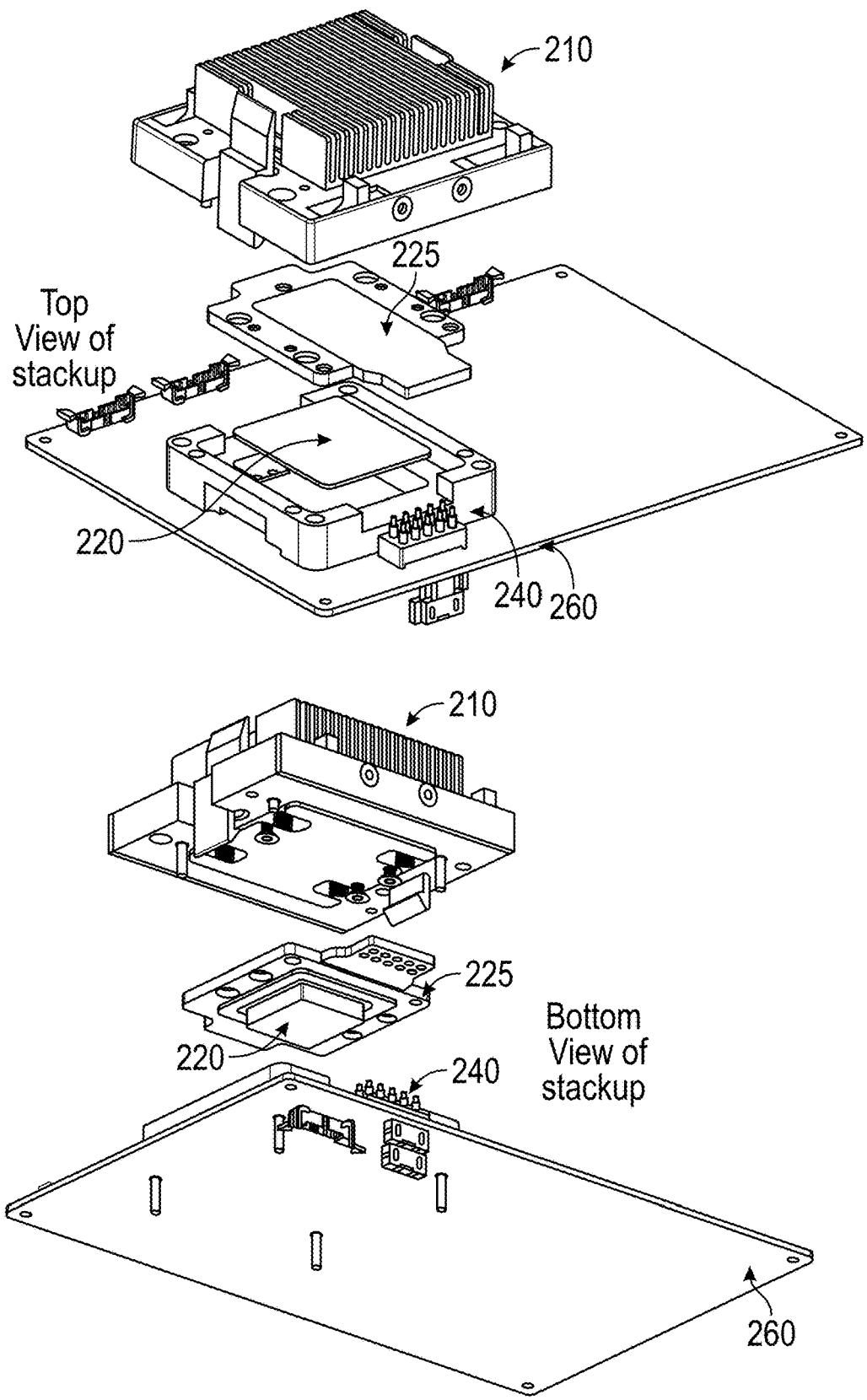
FIG. 2 illustrates a top view and a bottom view of a stack-up of various components of an integrated test cell of an ATE system using an active thermal interposer in accordance with an embodiment of the invention.

FIG. 2 illustrates a top view and a bottom view of a stack-up of various components of an integrated test cell using an active thermal interposer in accordance with an embodiment of the invention. The integrated test cell comprises a socket interface board (SIB) 260. The SIB comprises a device application specific design.

Further, the integrated cell comprises a socket 240 having a DUT specific design, e.g., with pogos and a side structure 241 as shown in FIG. 2. The socket 240 may be configured to power the active thermal interposer from the bottom of the SIB.

The integrated cell also comprises the ATI 220. The active thermal interposer is specific to the DUT placed in the socket. The ATI 220 can be powered from the bottom of the SIB or from the top. The ATI can, in one embodiment, accommodate multiple dies and heights (associated with the DUT). In one embodiment, the interposer may be passive. As noted above, the ATI is a distinct and discrete piece. This facilitates advantageously changing the ATI depending on the application. It can be a heat-only ATI to control the temperature more accurately or a thermoelectric based cool-only ATI to cool the DUT below the evaporator temperature, wherein different DUTs on the same TIB may be in contact with different types of ATIs.

Furthermore, the heating or cooling abilities reside in the interposer, therefore, a user has the option to determine how much power to supply to each interposer, which determines how hot a respective interposer becomes. Further, a user can determine whether each interposer will comprise a heating or cooling element individually. Because the interposer is a discrete piece (unlike conventional testers), a user has the freedom to advantageously swap it out and replace it with a thermal interposer that has different characteristics. Accordingly, each DUT on a TIB may be in contact with a thermal interposer that is specific to and can be customized for the respective DUT. For example, on a given TIB with 24 SIBs, 12 SIBs may comprise a first type of interposer that tests for high temperatures while the other 12 SIBs may comprise a second type of interposer that tests for lower temperatures.

Combining the thermal characteristics into the interposer also advantageously precludes any need for extra interfaces between the DUT and the thermal system, which was a drawback of conventional tester systems.

In an embodiment, the integrated cell comprises a superstructure/lid 225 that contains the passive or active thermal interposer 220. The superstructure 225 accommodates the thermal interposer 220 and, alternatively, may also accommodate a POP memory nest or passive interposer with different actuation forces. The superstructure 225 may also comprise a power interface to the active thermal interposer 220.

In an embodiment, the integrated cell may optionally comprise a heatsink 210. The heatsink 210 may be designed for high power dissipation and may also comprise a fan. In an embodiment, a parallel socket actuation system is used that places and actuates superstructures (socket lids) providing contact force to the DUT. As noted above, the superstructures may contain the ATI or passive interposers.

The socket actuation system provides the force to bring the thermal interposer in contact with the DUT. Conventional tester systems, by comparison, either use a closed socket system where the socket would apply pressure to the DUT. Alternatively, conventional tester systems use contact force applied from the thermal array or force array to hold the DUT in the socket comes. Embodiments of the present invention, however, comprise a parallel socket actuation system that actuates superstructures to hold the DUTs on a TIB in place.

The PSA, in accordance with embodiments of the present invention, aligns the superstructure individually but actuates in parallel. The system can also be easily modified to incorporate active thermal interposers as part of the superstructure. Alternatively, the system can be modified to incorporate a passive interposer or POP memory or other alternate structures.

Figure 3:
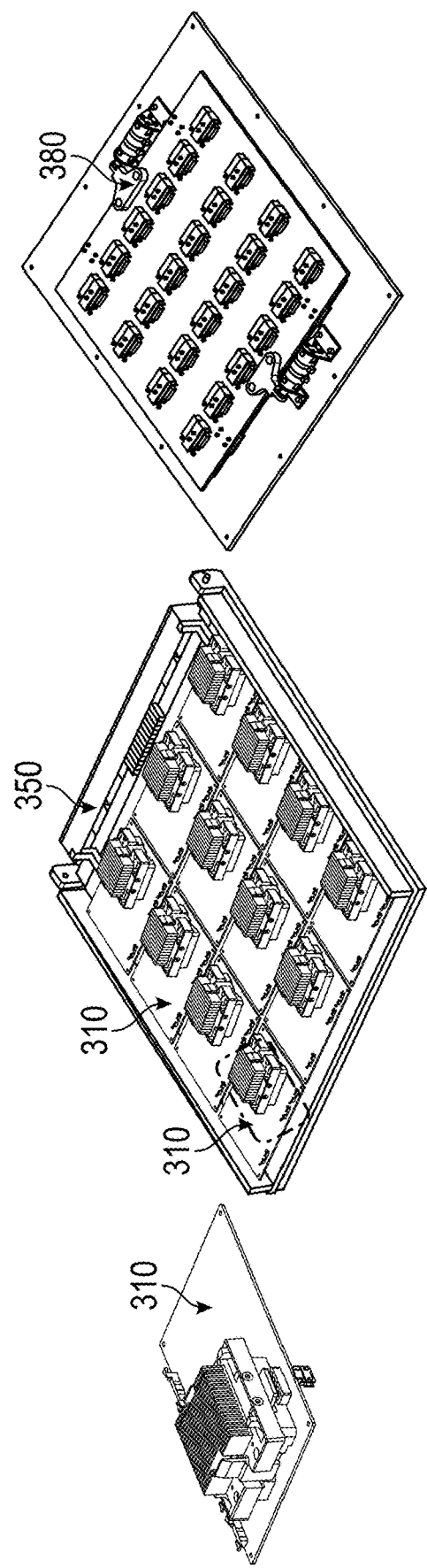
FIG. 3 illustrates the manner in which all the sockets on a TIB are actuated in accordance with an embodiment of the invention.

FIG. 3 illustrates the manner in which all the sockets on a TIB are actuated in accordance with an embodiment of the invention. As noted above, a TIB 350 comprises several SIBs 310. The PSA 380 actuates all the sockets in parallel while ensuring that the alignment for each socket is handled individually. In other words, the PSA aligns each socket individually but advantageously actuates in parallel. The PSA can place ATIs (which are built into the superstructure or lid) on the DUT and actuate several ATIs in parallel. The PSA, in one embodiment, can also place passive interposers with limited thermal capability. The PSA in other embodiments may also work with memory nests or alternate POP structures or some combination of ATIs with POP structures.

Embodiments of the present invention advantageously use an ATI in coordination with a PSA, which solves several architectural and flexibility problems that occurred in conventional architectures. The ATI, in one embodiment, can be powered from the TIB/SIB or can be powered from a thermal head in a slot of a tester (within which the TIB is placed). Furthermore, the ATI, in one embodiment, can be customized with precision heaters, zone cooling, multi-die contact, gimbaling or optional cooling.

Figure 4:
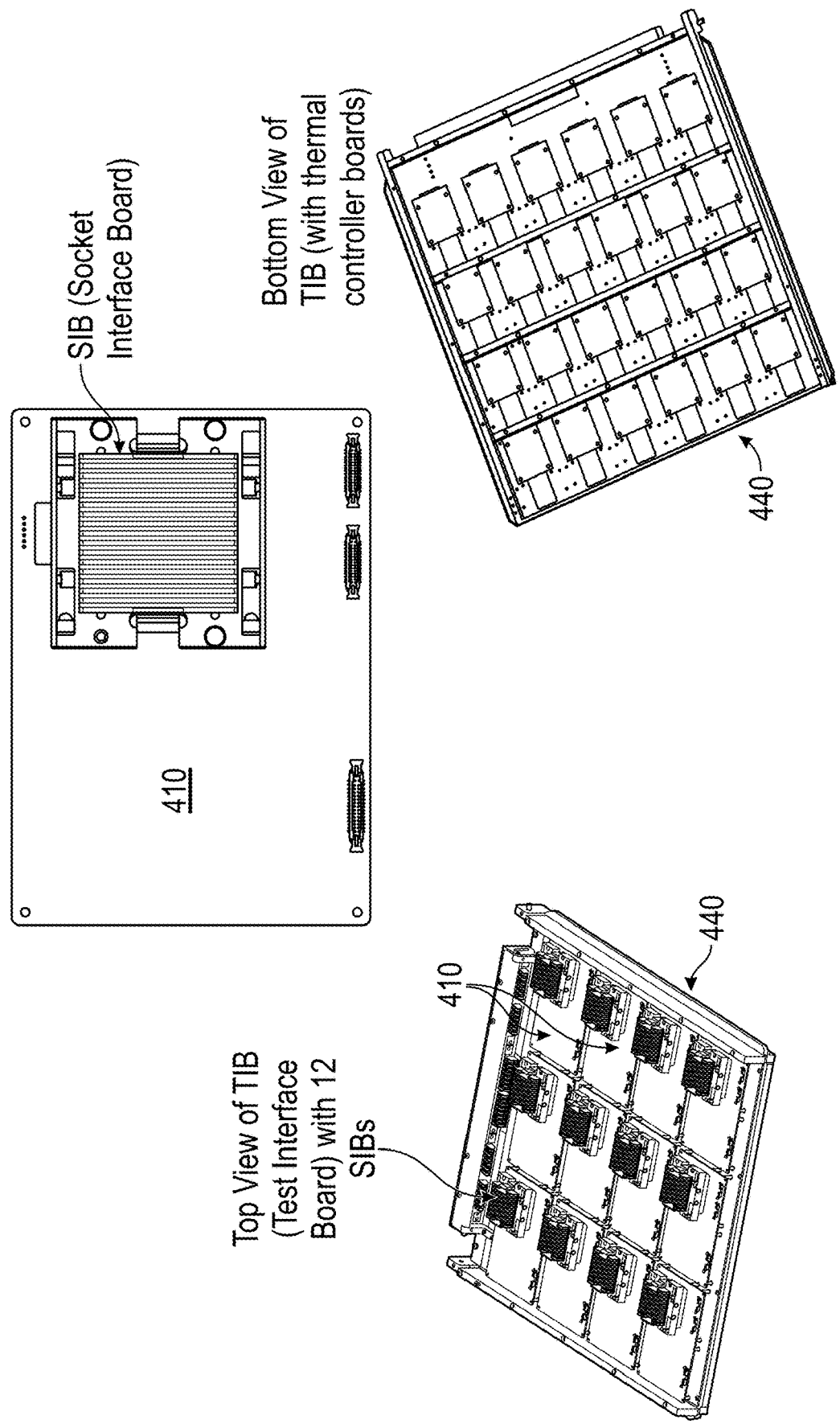
FIG. 4 illustrates a top and a bottom view of a TIB in accordance with an embodiment of the invention.

FIG. 4 illustrates a top and a bottom view of a TIB in accordance with an embodiment of the invention. As shown in FIG. 4, each TIB 440 comprises several SIBs 410. The sockets on all the SIBs on a TIB are actuated in parallel by a PSA.

Figure 5:
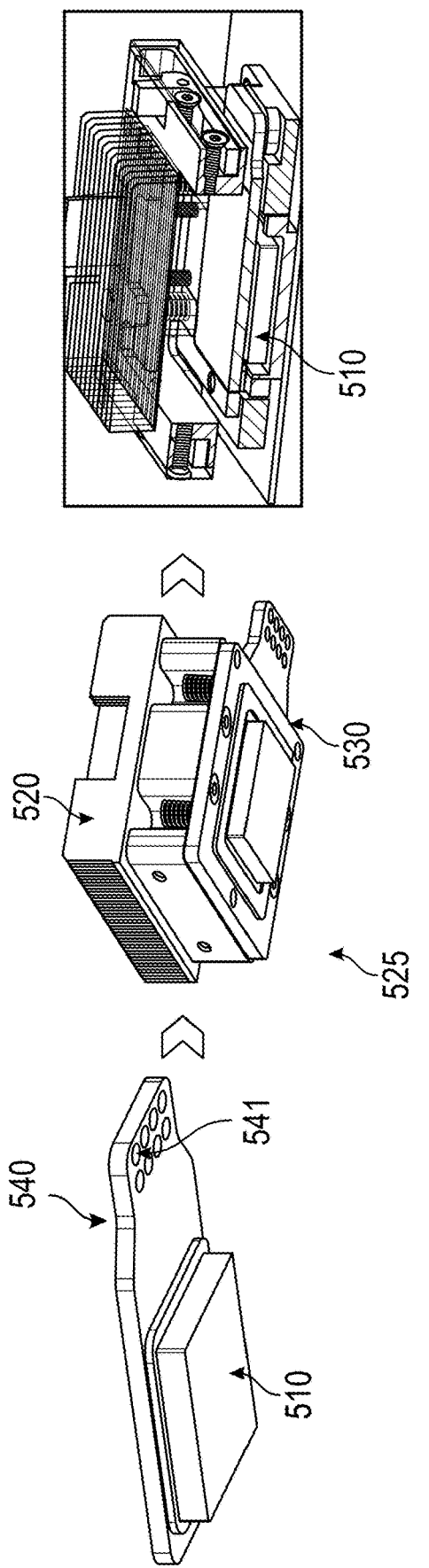
FIG. 5 illustrates the manner in which a thermal interposer fits into a superstructure that contains the active thermal interposer in accordance with an embodiment of the present invention.

FIG. 5 illustrates the manner in which a thermal interposer fits into a superstructure that contains the active thermal interposer in accordance with an embodiment of the present invention. The thermal interposer 510 is affixed to a plate 540 that comprises the electrical contacts 541 to which voltage is provided to heat or cool the interposer. In conventional systems, the thermal interposer would have obtained power from a thermal control system that would have been one or more layers removed. By contrast, in the embodiment of FIG. 5, the thermal interposer is a discrete structure that obtains power from a plate that is closer to the socket (and not separated by one or more interfaces).

As shown in FIG. 5, the thermal interposer slides into a larger assembly 520 (comprising the superstructure and the thermal system 525), where the assembly 520 is actuated by a motor associated with the PSA to apply the contact force to the DUT, and where the thermal system 525 is coupled to the DUT by universal interface 530 of thermal system 525.

Figure 6:
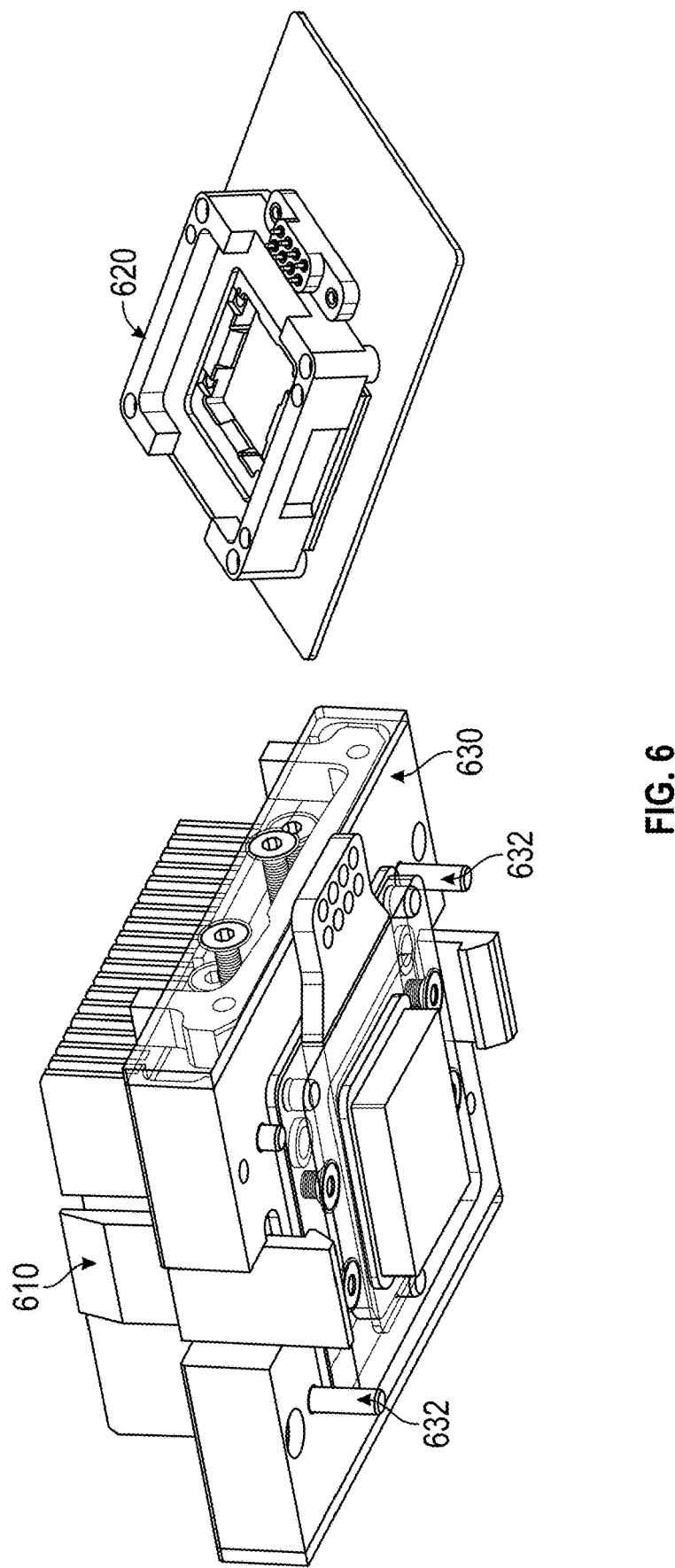
FIG. 6 illustrates the manner in which the superstructure including the active thermal interposer fits into a socket in accordance with an embodiment of the present invention.

FIG. 6 illustrates the manner in which the superstructure including the active thermal interposer fits into a socket in accordance with an embodiment of the present invention. As mentioned above, the PSA comprises a motor that engages the cam latches 610, which latch onto the socket and exert a pulling motion. This cam latch mechanism applies contact force to the superstructure 630 so it is pushed into the socket 620. It is appreciated that the cam latches 610 allow the amount of force that is applied to be configurable. For example, using larger cam latches applies more force than using smaller cam latches.

FIG. 6 also illustrates alignment pins 632 disposed on the superstructure 630 that are used to align the interposer with the DUT. Every individual socket has its own alignment features. Each individual socket has its own alignment pins so the alignment of each sockets occurs individually. But the actuations of all the sockets on a TIB occur simultaneously using the PSA. When the cam latches actuate, the alignment pins get pushed into each respective socket and lock into the respective socket. The PSA, therefore, is responsible for both the alignment and the actuation of the sockets.

Figure 7:
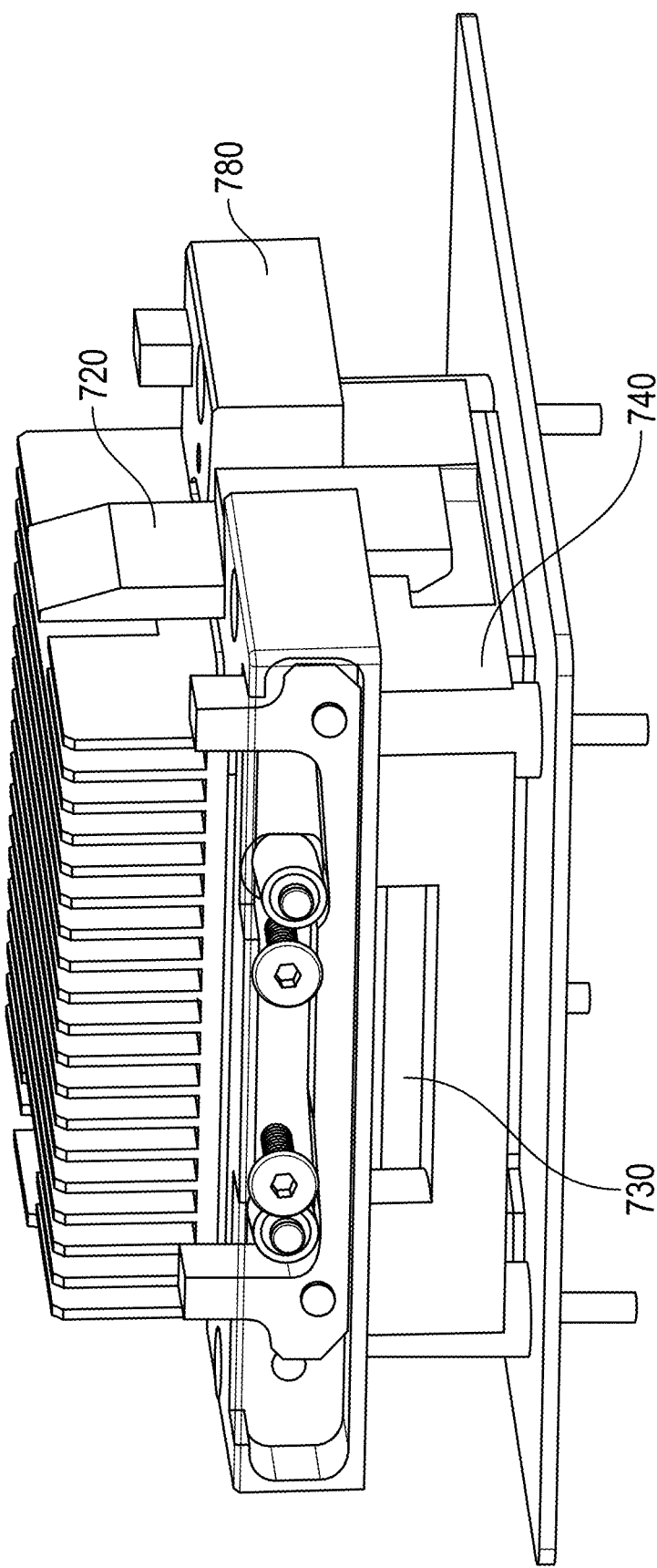
FIG. 7 illustrates the manner in which the cam-latch mechanism latches underneath the socket in accordance with an embodiment of the present invention.

FIG. 7 illustrates the manner in which the cam latch mechanism latches underneath the socket in accordance with an embodiment of the present invention. As shown in FIG. 7, the cam latch 720 latches onto the socket 740 thereby exerting a pulling motion. This pulling motion pushes the superstructure 780 downwards and allows the interposer 730 to come into contact with the DUT.

Figure 8:
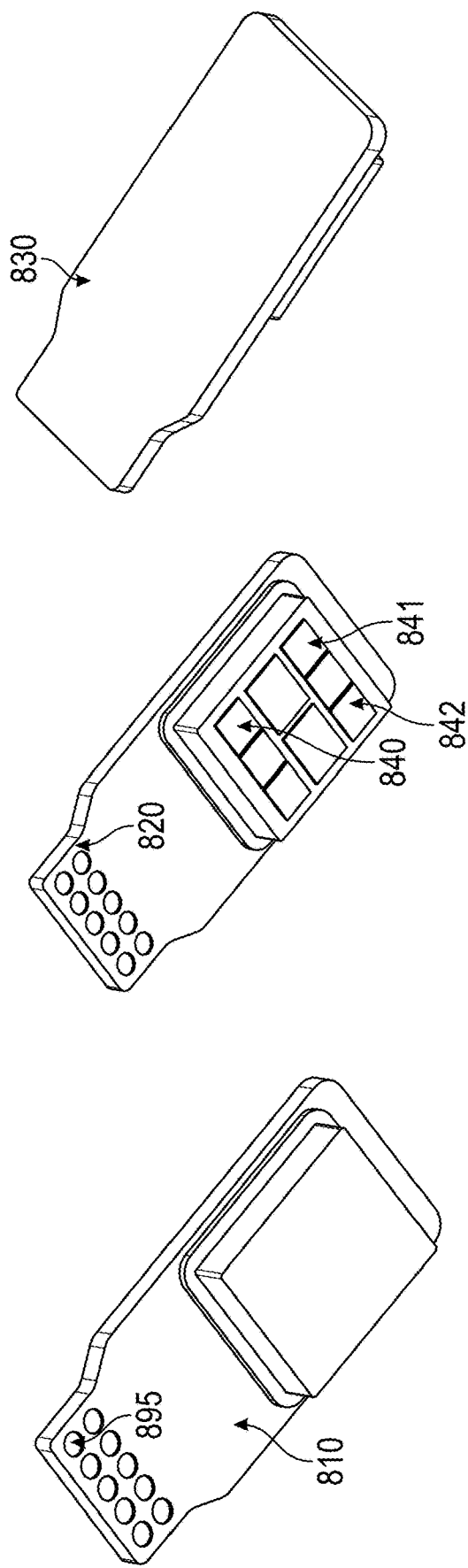
FIG. 8 illustrates different types of surfaces associated with the active thermal interposer in accordance with an embodiment of the present invention.

FIG. 8 illustrates different types of surfaces associated with the active thermal interposer in accordance with an embodiment of the present invention. As shown in FIG. 8, if the DUT being tested is a regular DUT that comprises a single device, the interposer 810 will typically comprise a flat surface.

Some DUTs, however, have multiple surfaces on the DUT itself. For example, a DUT may comprise a single processor device with multiple memory devices around the processor. In such instances, the interposer may be modified. In an embodiment, interposer 820 may comprise multiple steps 840 of different heights associated with the interposer. The steps are designed to match the surface of the DUT. For example, sometimes DUTs may comprise multiple chips, where each chip may have a slightly different height than the other chips.

The interposer 820 can, therefore, be designed with steps 840 comprising different heights so that intimate contact can be made with the DUT. In one embodiment, the steps 840 may be heating or cooling elements in themselves. In an embodiment, different amounts of voltage may be provided to different steps. For example, 100 watts of heating may be provided to step 842 while only 50 watts of heating may be applied to step 841. Accordingly, the user can vary the power by area and the design of the interposer also.

As noted previously, the thermal interposer also comprises a plate 830 affixed to it that comprises the electrical contacts 895 to which voltage is provided to heat or cool the interposer.

Figure 9:
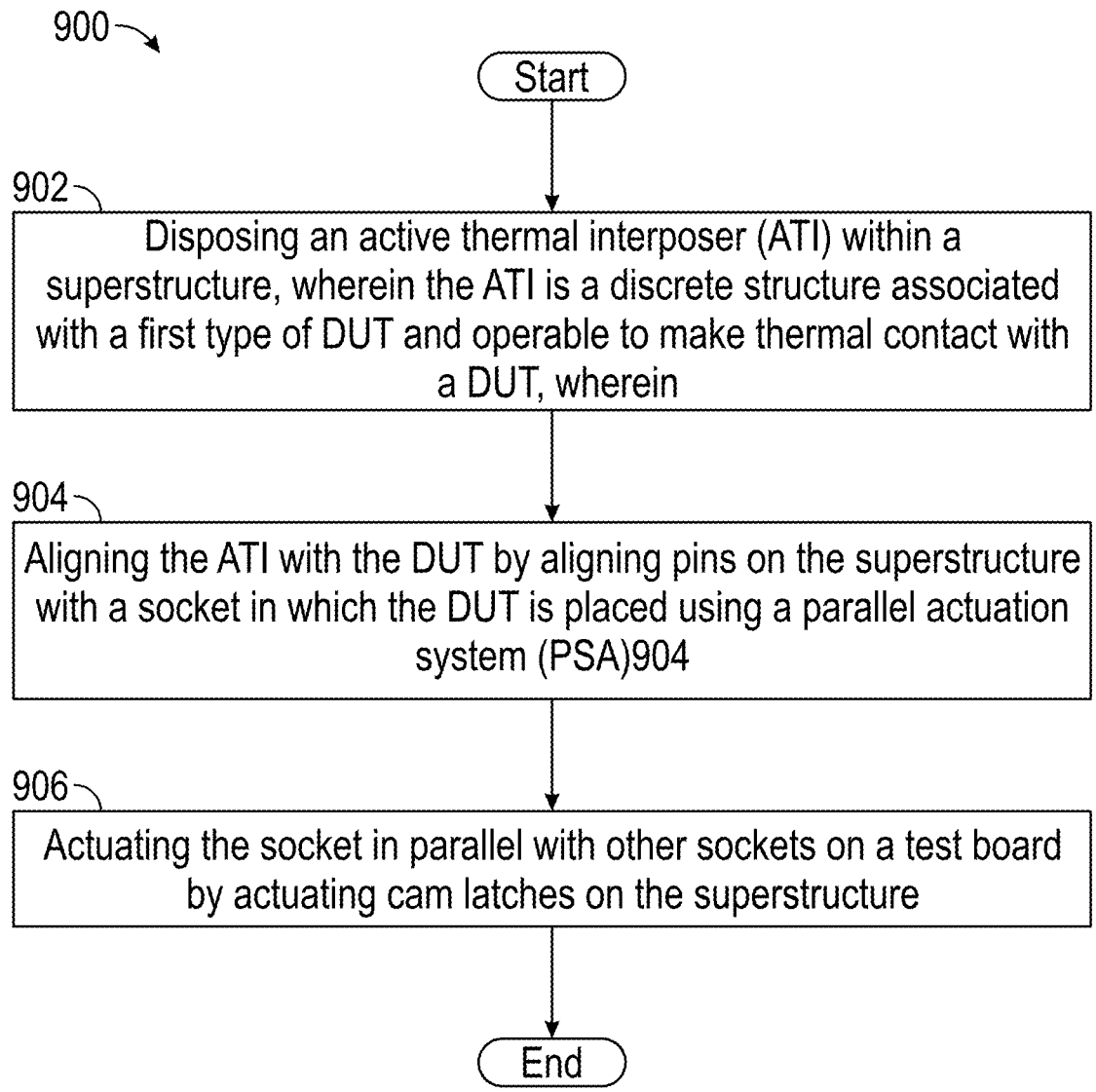
FIG. 9 depicts a flowchart illustrating an exemplary process for using an ATI with parallel socket actuation in an integrated test cell in accordance with an embodiment of the present invention.

FIG. 9 depicts a flowchart illustrating an exemplary process 900 for using an ATI with parallel socket actuation in an integrated test cell in accordance with an embodiment of the present invention. While the various steps in this flowchart are presented and described sequentially, one of ordinary skill will appreciate that some or all of the steps can be executed in different orders and some or all of the steps can be executed in parallel. Further, in one or more embodiments of the invention, one or more of the steps described below can be omitted, repeated, and/or performed in a different order. Accordingly, the specific arrangement of steps shown in FIG. 9 should not be construed as limiting the scope of the invention. Rather, it will be apparent to persons skilled in the relevant art(s) from the teachings provided herein that other functional flows are within the scope and spirit of the present invention. Flowchart 900 may be described with continued reference to exemplary embodiments described above, though the method is not limited to those embodiments.

At step 902, an ATI is disposed within a superstructure, wherein the ATI is operable to make thermal contact with a DUT on a test board, wherein the test board comprises a plurality of ATIs, where each ATI is associated with a respective type of DUT.

At step 904, the ATI is aligned with the DUT by aligning pins on the superstructure with a socket in which the DUT is placed using the PSA.

At step 906, the socket is actuated in parallel with other sockets on the test board, where the actuating comprises actuating a cam latch on the superstructure to latch onto the socket.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A testing apparatus comprising:
a test interface board comprising a plurality of socket interface boards, wherein each socket interface board comprises:
a socket operable to receive and secure a device under test (DUT);
a discrete active thermal interposer operable to selectively produce thermal properties and further operable to make thermal contact with the DUT for heating and cooling the DUT based on the thermal properties;
a superstructure operable to contain the discrete active thermal interposer; and
an actuation mechanism operable to provide force to bring the discrete active thermal interposer into the thermal contact with the DUT; and
wherein the actuation mechanism is part of a parallel actuation mechanism operable to simultaneously actuate sockets on the plurality of socket interface boards to simultaneously bring a plurality of DUTs into thermal contact with a plurality of discrete active thermal interposers.

2. The testing apparatus of claim 1, wherein a surface design of the discrete thermal interposer is customized to a type of the DUT in the socket.

3. The testing apparatus of claim 1, wherein the socket is an open socket, and wherein a design of the socket is customized to a type of the DUT.

4. The testing apparatus of claim 1, further comprising:
a thermal system operable to selectively heat or cool the (DUT) and comprising a universal interface, wherein the thermal system is operable to make contact with the discrete active thermal interposer.

5. The testing apparatus of claim 1, wherein the discrete active thermal interposer is replaceable with a different discrete active thermal interposer comprising different thermal properties.

6. The testing apparatus of claim 1, further comprising a heat sink operable to dissipate heat.

7. The testing apparatus of claim 1, wherein the discrete active thermal interposer is affixed to a plate comprising electrical contacts to which voltage is applied to selectively heat or cool the discrete active thermal interposer.

8. The testing apparatus of claim 1 further comprising test circuitry for simultaneously testing said plurality of DUTs while said plurality of DUTs are in said thermal contact with said plurality of discrete active thermal interposers.

9. A testing apparatus comprising:
- a test interface board comprising a plurality of socket interface boards, wherein each socket interface board comprises:
  - an open socket operable to receive and secure a device under test (DUT);
  - a passive interposer operable to make thermal contact with the DUT;
  - a superstructure operable to contain the passive interposer;
  - an actuation mechanism operable to provide force to bring the passive interposer into the thermal contact with the DUT; and
  - a thermal system operable to selectively heat or cool the DUT and comprising a universal interface, wherein the thermal system is operable to contact the passive interposer; and
- a parallel actuation mechanism comprising the actuation mechanism, wherein the parallel actuation mechanism is operable to simultaneously actuate sockets on the plurality of socket interface boards to simultaneously bring a plurality of DUTs into thermal contact with a plurality of passive interposers.

10. The testing apparatus of claim 9 further comprising testing circuitry to simultaneously test said plurality of DUTs while said plurality of DUTs are in the thermal contact with the plurality of passive interposers.

11. The testing apparatus of claim 9, wherein a surface design of the passive interposer is customized to a type of the DUT in the open socket.

12. The testing apparatus of claim 9, wherein a design of the open socket is customized to a type of the DUT.

13. The testing apparatus of claim 9, further comprising a heat sink operable to dissipate heat.

14. A method of configuring an integrated test cell, the method comprising:
- disposing within a superstructure a discrete active thermal interposer device operable to produce thermal properties and further operable to make thermal contact with a device under test (DUT), the DUT secured within a socket of socket interface board;
- aligning the discrete active thermal interposer device with the DUT by aligning pins on the superstructure within the socket in which the DUT is disposed using a parallel actuation system; and
- actuating the socket in parallel with other sockets that are disposed on a same test board as the superstructure, wherein the actuating comprises actuating one or more cam latches on the superstructure to provide force to bring the discrete active thermal interposer device in thermal contact with the DUT; and
- wherein a plurality of DUTs are secured within said other sockets, wherein a plurality of discrete active thermal interposer devices are associated with said other sockets and further wherein said actuating is operable to simultaneously bring the plurality of discrete active thermal interposer devices into thermal contact with said plurality of DUTs.

15. The method of claim 14, wherein a surface design of the discrete active thermal interposer device is customized to a type of the DUT in the socket.

16. The method of claim 14, wherein the socket is an open socket, and wherein a design of the open socket is customized to a type of the DUT.

17. The method of claim 14, further comprising:
- replacing the discrete active thermal interposer device for a different discrete active thermal interposer device comprising different thermal properties.

18. The method of claim 14, further comprising affixing the discrete active thermal interposer device to a plate and wherein the plate comprises electrical contacts to which voltage is applied to selectively heat or cool the discrete active thermal interposer device.

* * * * *